(12) United States Patent
Liang

(10) Patent No.: US 8,605,444 B2
(45) Date of Patent: Dec. 10, 2013

(54) SERVER CABINET

(75) Inventor: An-Gang Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 5 days.

(21) Appl. No.: 13/426,626

(22) Filed: Mar. 22, 2012

(65) Prior Publication Data

US 2013/0127314 A1    May 23, 2013

(51) Int. Cl.
*H05K 5/00* (2006.01)
*H05K 7/00* (2006.01)
*A47B 81/00* (2006.01)
*A47B 97/00* (2006.01)

(52) U.S. Cl.
USPC ........... 361/727; 361/724; 361/725; 361/726; 312/223.2; 312/223.3

(58) Field of Classification Search
USPC .............. 361/724, 725, 726, 727; 312/223.1, 312/223.2, 223.3
See application file for complete search history.

(56) References Cited

U.S. PATENT DOCUMENTS

| | | | |
|---|---|---|---|
| 6,652,297 B1 * | 11/2003 | Zhang et al. | 439/136 |
| 8,127,562 B2 * | 3/2012 | Gilder | 62/89 |
| 2010/0229584 A1 * | 9/2010 | Gilder | 62/259.1 |

* cited by examiner

*Primary Examiner* — Anthony Haughton
(74) *Attorney, Agent, or Firm* — Altis Law Group, Inc.

(57) ABSTRACT

A server cabinet includes a housing and a slide plate. The housing includes a plate defining an opening. Two opposite slide rails extend from the plate, adjacent to opposite sides of the opening. The slide plate is slidably attached the slide rails to adjustably cover or uncover the opening. The slide plate defines a row of hooking slots. A latch protrudes from one of the slide rails to engage in one of the hooking slots for positioning the slide plate.

5 Claims, 7 Drawing Sheets

SERVER CABINET

BACKGROUND

1. Technical Field

The present disclosure relates to a server cabinet.

2. Description of Related Art

In a server cabinet, a power distribution unit (PDU) may be mounted at a front side of the cabinet, and interfaces of servers are at the rear of the servers. Therefore, it is necessary to define an opening for cables in the cabinet, which extend through the opening and connect the interfaces of the servers and the PDU. The number of the cables varies as the number of the servers varies. When the number of the cables is small, the opening has a large area of venting, which will disturb airflow in the cabinet.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
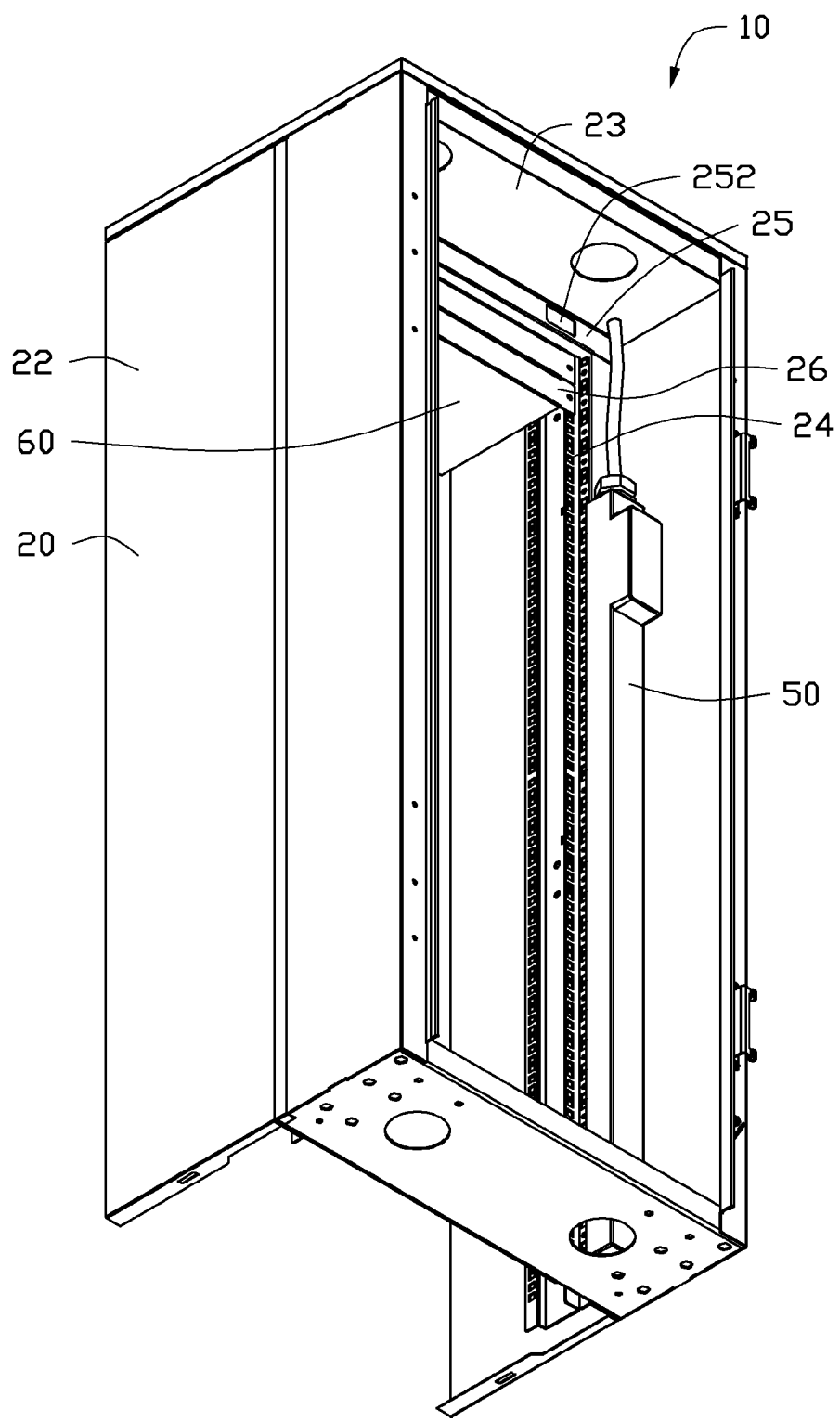
FIG. 1 is an assembled view of an exemplary embodiment of a server cabinet, wherein the cabinet includes a slide plate.
Figure 2:
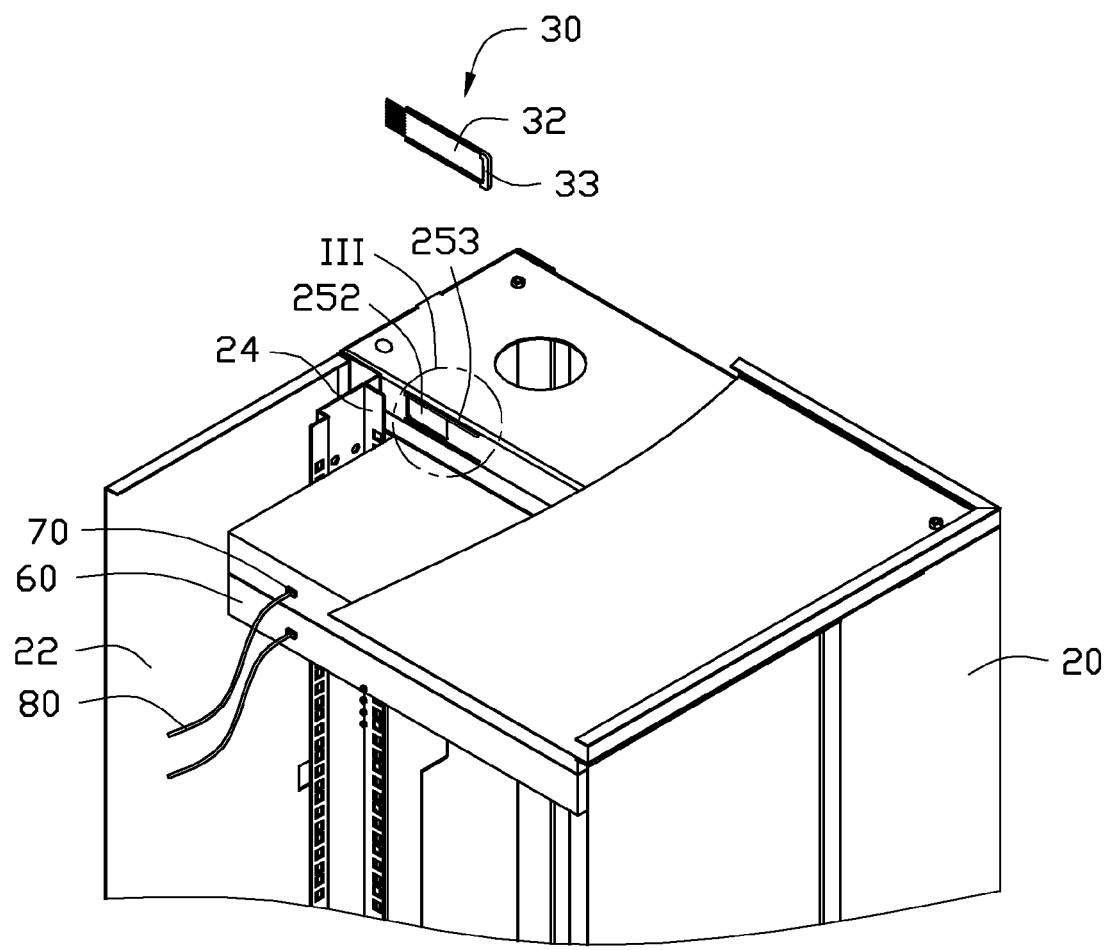
FIG. 2 is an exploded, isometric view of FIG. 1, but viewed from a different perspective.
Figure 3:
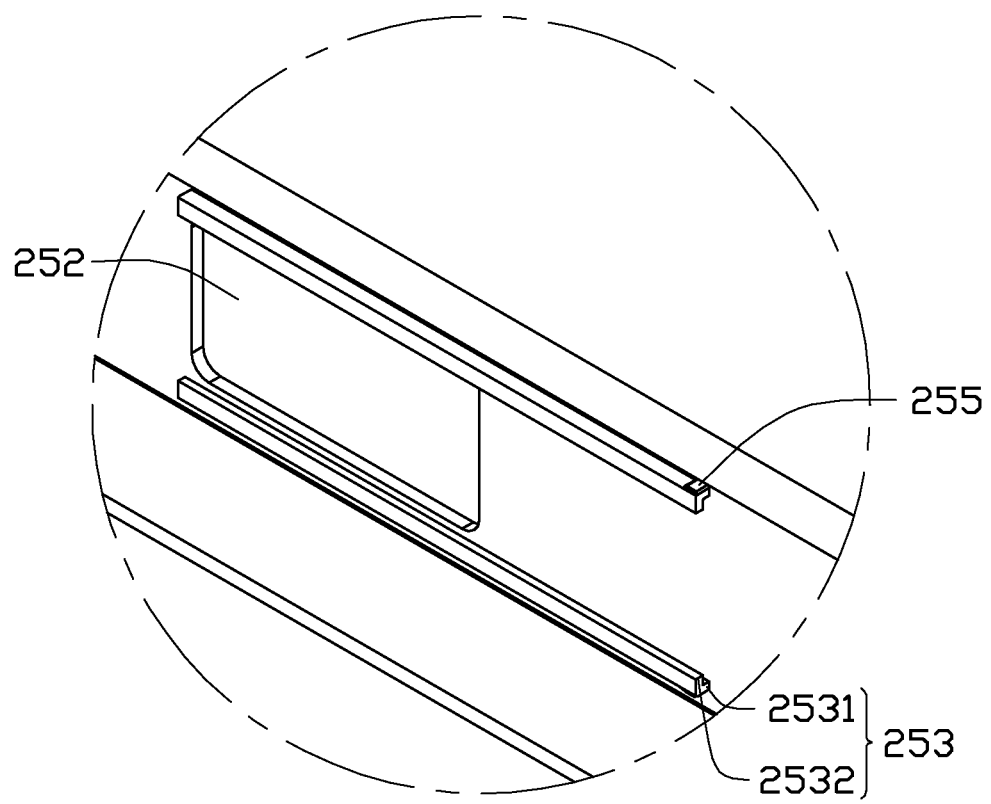
FIG. 3 is an enlarged view of a circled portion III of FIG. 2.

FIGS. 1-3, show an exemplary embodiment of a server cabinet 10 including a housing 20 and a slide plate 30.

The housing 20 includes two opposite side plates 22, and a top plate 23 perpendicularly connected between tops of the side plates 22. An elongated bracket 24 is longitudinally mounted on an inner surface of each side plate 22. A plurality of mounting plates 26 is perpendicularly connected between the brackets 24, arranged from top to bottom. A server 60 is fixed to a rear side surface of each mounting plate 26. A power distribution unit (PDU) 50 is mounted on the inner surface of one of the side plates 22, in front of the mounting plates 26. A plate 25 perpendicularly extends down from the top plate 23, with opposite ends adjoining the side plates 22. The plate 25 is located above the brackets 24. An opening 252 is defined in the plate 25. Two L-shaped slide rails 253 extend from a rear side surface of the plate 25, respectively above and below the opening 252. Each slide rail 253 includes an extension portion 2531 extending perpendicularly from the plate 25 and a stop portion 2532 extending from a side of the extension portion 2531 opposite to the plate 25 toward the other slide rail 253. A latch 255 protrudes from a first end of an outer side of each extension portion 2531 opposite to the other extension portion 2531.

Figure 4:
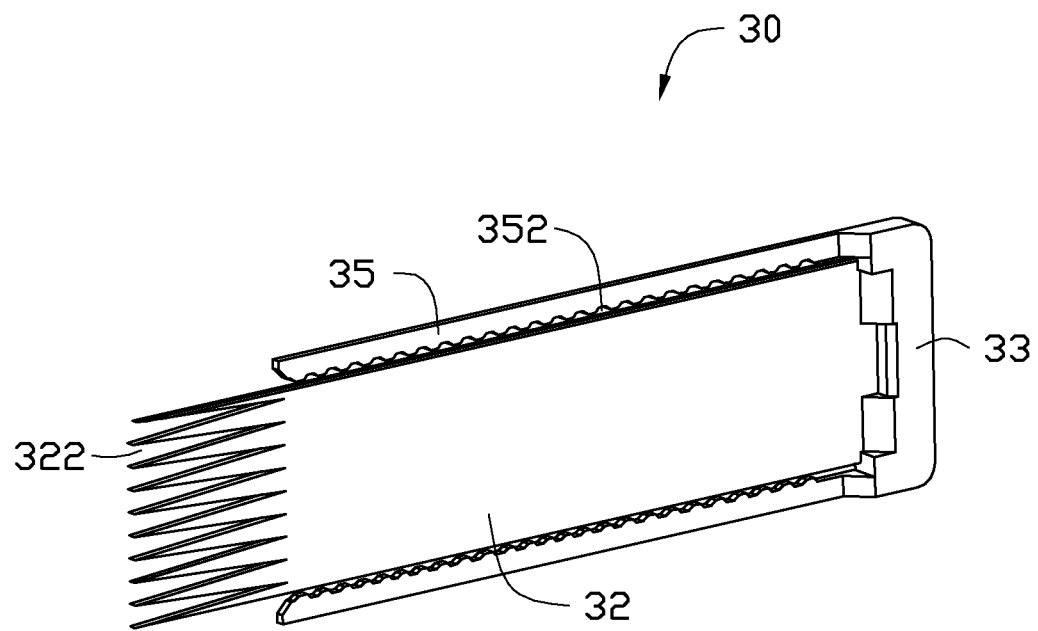
FIG. 4 is an enlarged view of the slide plate of FIG. 2, but viewed from another perspective.

FIG. 4, shows the slide plate 30 including a rectangular main body 32 and an operation portion 33 formed at a first end of the main body 32. A plurality of V-shaped through slots 322 is longitudinally defined in a second end of the slide plate 30 opposite to the first end. Two elongated bars 35 extend perpendicularly from opposite ends of the operation portion 33 toward the second end of the slide plate 30, respectively adjacent to opposite sides of the main body 32. A first side of each bar 35 facing the other bar 35 defines a row of jagged hooking slots 352.

Figure 5:
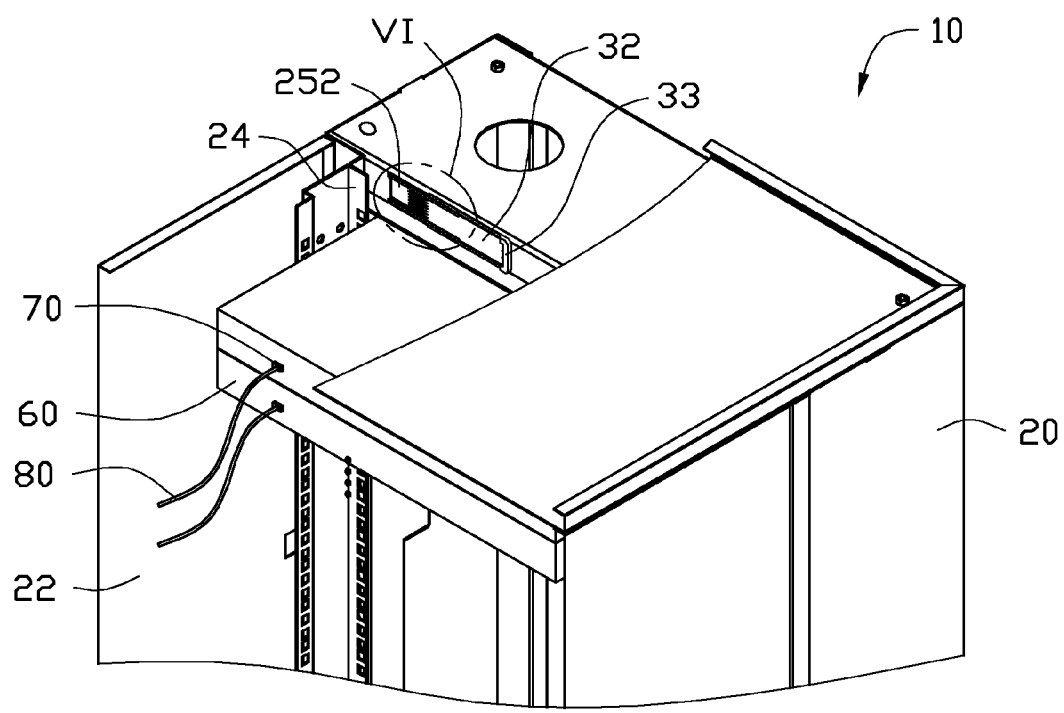
FIG. 5 is an assembled, isometric view of FIG. 2.
Figure 6:
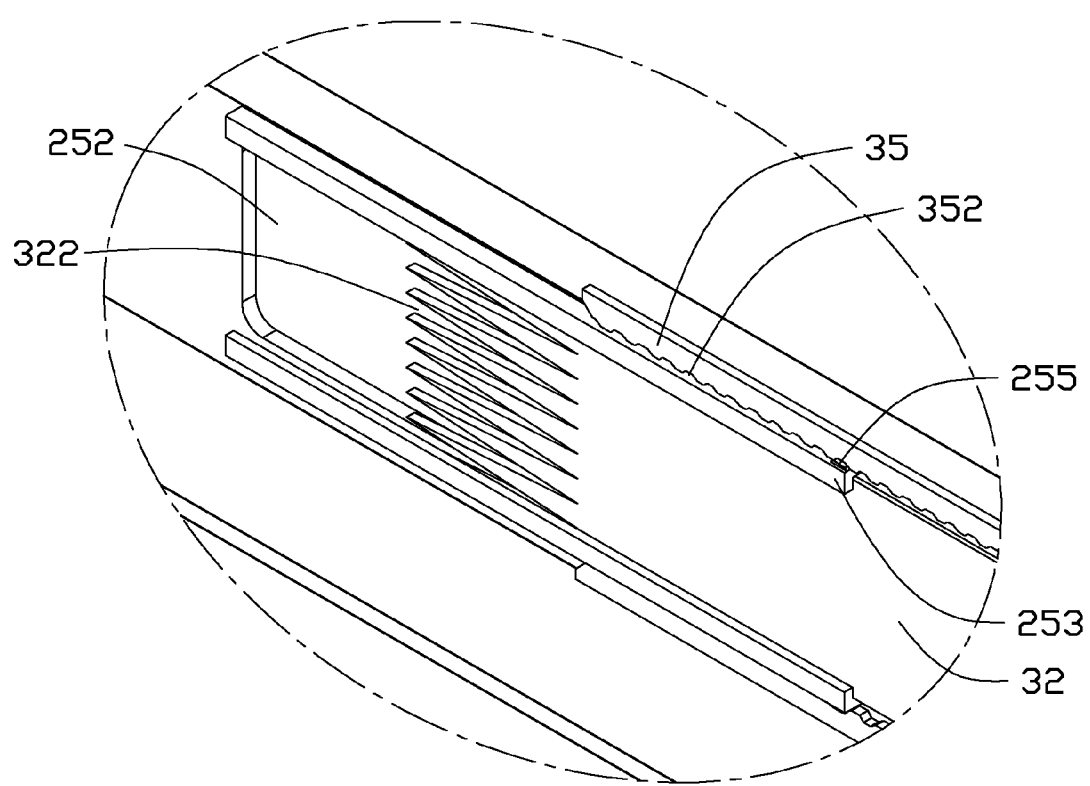
FIG. 6 is an enlarged view of a circled portion VI of FIG. 5.

FIGS. 5 and 6, show in assembly, the main body 32 is slidably engaged in the slide rails 253. The bars 35 are respectively located at outer sides of the slide rail 253. Each latch 255 engages in one of the hooking slots 352 of a corresponding bar 35, for keeping the slide plate 30 in a desired position.

A plurality of cables 80 extends through the opening 252, with opposite ends of the cables connected to the PDU 50 and interfaces 70 at rear sides of the servers 60.

When the amount of the cables 80 is large, the slide plate 30 is slid toward the first end of the slide rails 253 for exposing most of the opening 252. When the amount of the cables 80 is small, the slide plate 30 is slid toward the opposite end of the slide rails 253 for covering most of the opening 252.

Figure 7:
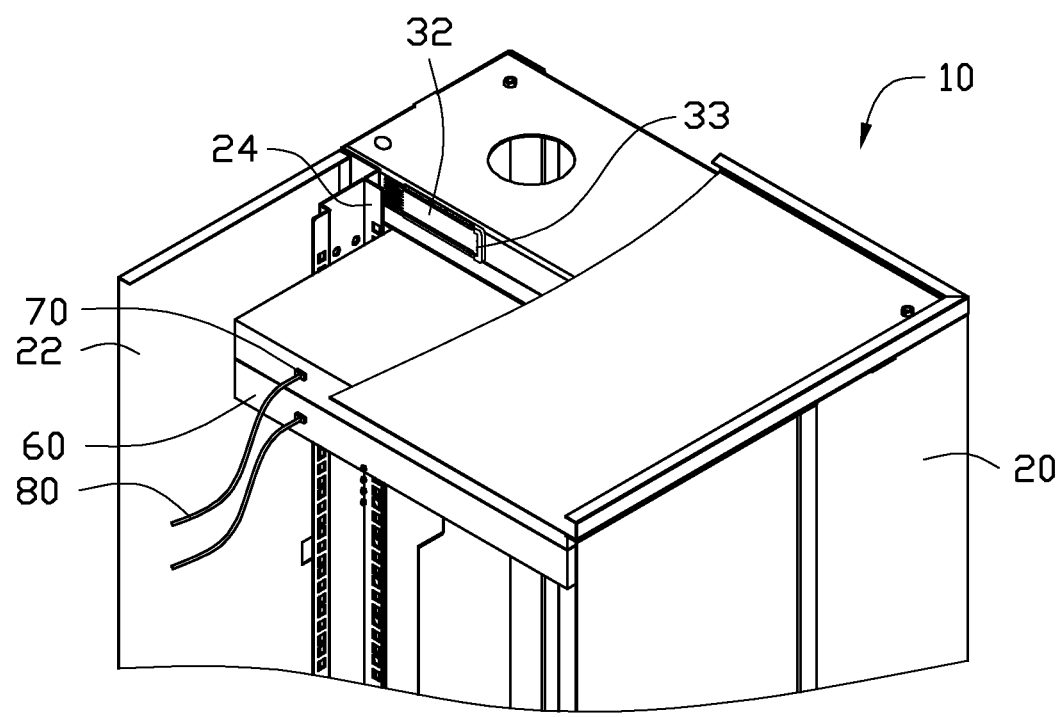
FIG. 7 is similar to FIG. 5, but shows a different state.

Referring to FIG. 7, when there is no cable 80 extending through the opening 252, the slide plate 30 is slid to completely cover the opening 252.

In accordance with the amount of the cables 80, the slide plate 30 is slid to minimize the opening 252 to minimize interference to airflow in the cabinet 10. The slide plate 30 defines the through slots 322 for cables 80 to extend through, to further minimize the opening 252.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A server cabinet comprising:
   a housing comprising a plate defining an opening, and two opposite slide rails extending from the plate and adjacent to opposite sides of the opening; and
   a slide plate slidably mounted to the slide rails to adjustably cover or uncover the opening, and defining a row of hooking slots, a latch protruding from one of the slide rails to engage in one of the hooking slots for positioning the slide plate;
   wherein a power distribution unit (PDU) is mounted in the housing, in front of the plate, a plurality of servers is mounted behind the plate, a plurality of cables extends through the opening with opposite ends of the cables connected to the PDU and the servers.

2. The server cabinet of claim 1, wherein the slide rails are substantially L-shaped, the slide plate comprises a main body slidably sandwiched between the slide rails.

3. The server cabinet of claim 2, wherein the slide plate further comprises a bar located at an outer side of the corresponding slide rail opposite to the main body, the row of hooking slots is defined in a side of the bar facing the slide rail, the bar and the main body sandwich the corresponding slide rail.

4. The server cabinet of claim 2, wherein an operation portion is formed on the slide plate.

5. The cabinet of claim 2, wherein the main body defines a plurality of through slots facing the opening of the plate, for the cables extending through.

\* \* \* \* \*